(12) United States Patent
Liu et al.

(10) Patent No.: US 11,259,433 B1
(45) Date of Patent: Feb. 22, 2022

(54) APPARATUS FOR UTILIZING A PLURALITY OF REGULATING COMPONENTS FOR COMMUNICATING RADIO FREQUENCY SIGNALS

(71) Applicant: SHENZHEN SUNWAY COMMUNICATION CO., LTD., Guangdong (CN)

(72) Inventors: Hongwei Liu, San Diego, CA (US); Suganthan Shanmuganathan, San Diego, CA (US); Kiran Vanjani, San Diego, CA (US)

(73) Assignee: SHENZHEN SUNWAY COMMUNICATION CO., LTD., Shenzhen (CN)

( * ) Notice: Subject to any disclaimer, the term of this patent is extended or adjusted under 35 U.S.C. 154(b) by 0 days.

(21) Appl. No.: 17/072,689

(22) Filed: Oct. 16, 2020

(51) Int. Cl.
*H05K 1/18* (2006.01)
*H05K 7/14* (2006.01)
*H05K 1/09* (2006.01)
*H05K 1/02* (2006.01)

(52) U.S. Cl.
CPC ......... *H05K 7/1427* (2013.01); *H05K 1/0277* (2013.01); *H05K 1/09* (2013.01); *H05K 1/181* (2013.01)

(58) Field of Classification Search
CPC ...... H05K 7/1427; H05K 1/0277; H05K 1/09; H05K 1/181
USPC ......................................... 361/749
See application file for complete search history.

(56) References Cited

U.S. PATENT DOCUMENTS 10,271,299 B1 * 4/2019 Sayem .............. H01Q 13/10
11,095,021 B2 * 8/2021 Sung ................ H05K 5/0017

* cited by examiner

*Primary Examiner* — Binh B Tran
(74) *Attorney, Agent, or Firm* — Oliff PLC (57) ABSTRACT

The invention discloses an apparatus for using regulating components for communicating radio frequency signals. The apparatus is equipped with a plurality of regulating components. At least two of the regulating components are connected through a connecting part, and one of the connected regulating components is in a feed connection with the circuit board. In use, the regulating components are used for communicating radio frequency signals.

19 Claims, 9 Drawing Sheets

APPARATUS FOR UTILIZING A PLURALITY OF REGULATING COMPONENTS FOR COMMUNICATING RADIO FREQUENCY SIGNALS

FIELD OF THE INVENTION

The invention relates to antennas, and more particularly to antennas for wearable devices.

BACKGROUND

The statement herein only provides background information relating to the invention and does not necessarily constitute the prior art.

With the rapid development of science and technology, smart wearable devices are becoming increasingly mainstream, wherein antennas are indispensable elements of the smart wearable devices for realizing untethered and tethered to smart phone wireless communication. For example, multi-band antennas covering GPS/BT/UWB/Wi-Fi 2.4 GHz, 5 GHz (1500-6000 MHz) are basic elements of smart watches.

Antenna radiators configured in the wearable devices as independent parts occupy a large space in the wearable devices and affect the overall design of the wearable devices. To fulfill larger displays and greater battery capacity, it still remains a challenge to reserve the space for the antennas.

BRIEF SUMMARY OF THE INVENTION

An apparatus for utilizing a plurality of regulating components for communicating radio frequency signals is provided. Included is a housing, a circuit board disposed in the housing, and a plurality of regulating components connected to the housing. At least two of the regulating components are connected through a connecting part, and one of the connected regulating components is in a feed connection with the circuit board. We are proposing using the existing regulating components for communicating radio frequency signals.

DETAILED DESCRIPTION OF THE INVENTION

Figure 1:
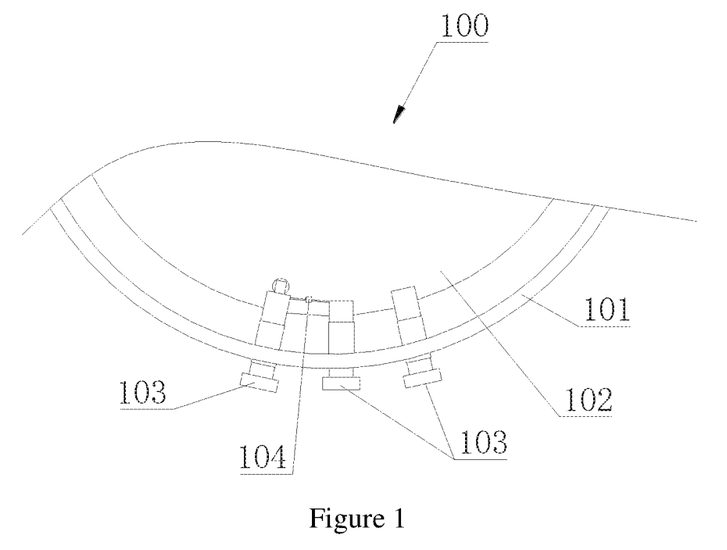
FIG. 1 illustrates an apparatus for utilizing existing a plurality of regulating components for communicating radio frequency signals, in accordance with one embodiment.

FIG. 1 illustrates an apparatus 100 for utilizing existing a plurality of regulating components for communicating radio frequency (RF) signals. As shown, the apparatus includes a housing 101, a circuit board 102 and a plurality of regulating components 103, wherein the circuit board 102 is disposed in the housing 101; the plurality of regulating components 103 are respectively connected to the housing 101, at least two of the regulating components 103 are connected through a connecting part 104, any one of the mutually connected regulating components 103 is in a feed connection with the circuit board 102, such that the other one of the connected regulating components 103 can be used as an antenna radiator for communicating radio frequency signals. To further improve the performance of the antenna, the regulating component 103 can be made of a conductive material. Of course, in another embodiment, the regulating component 103 may be made of a conductive material and an insulative material. In the context of the present description, the housing 101 may include any structure that is capable of having the regulating components 103 coupled thereto. The regulating components 103 may refer to any mechanisms that function as components for controlling a device associated with the housing 101.

In addition, the term "communicate" may refer to any receipt or transmission of signals. In different embodiments, the plurality of regulating components 103 may be in different connection relationships and have different feed positions for all frequency bands, for example GPS, BT (Bluetooth), WiFi and other medium-and-high cellular frequency bands (1.710 GHz-3.5 GHz).

In one embodiment, the apparatus 100 may be a wearable device, such as a watch (e.g. smart watch, etc.), glasses (e.g., smart glasses, etc.), a smart band, a pedometer or heat rate monitor. Of course, other embodiments are contemplated where the apparatus 100 may be a phone (e.g., smart phone, etc.), a personal digital assistant (PDA) or any other devices.

In one embodiment, the regulating components 103 are movably (e.g., slidably, etc.) coupled to the housing 101 and are configured to generate a signal in response to a movement of the regulating components 103. For example, in one embodiment, the regulating components 103 are operable such that a signal is generated in response to a depression (e.g., manual depression, etc.) of the regulating components 103. Such signal could control at least one function of the apparatus 100. In such embodiment, the regulating components 103 may be push buttons. In other embodiments, the regulating components 103 may be rotatably (e.g., so as to be windable. etc.) coupled to the housing 101 and interact with internal mechanical components (e.g., winding spring, etc.) in the housing 101 to generate a signal, and in such embodiment, the regulating components 103 may be rotary knobs. Of course, any combination of different movements may be implemented for allowing any type of manipulation, in various embodiments. Of course, the regulating components 103 may be configured for only aesthetic purpose.

In an optional embodiment, each regulating component and the housing have one, two or more contact points therebetween.

More illustrative information will now be set forth regarding various optional architectures and uses in which the foregoing method may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
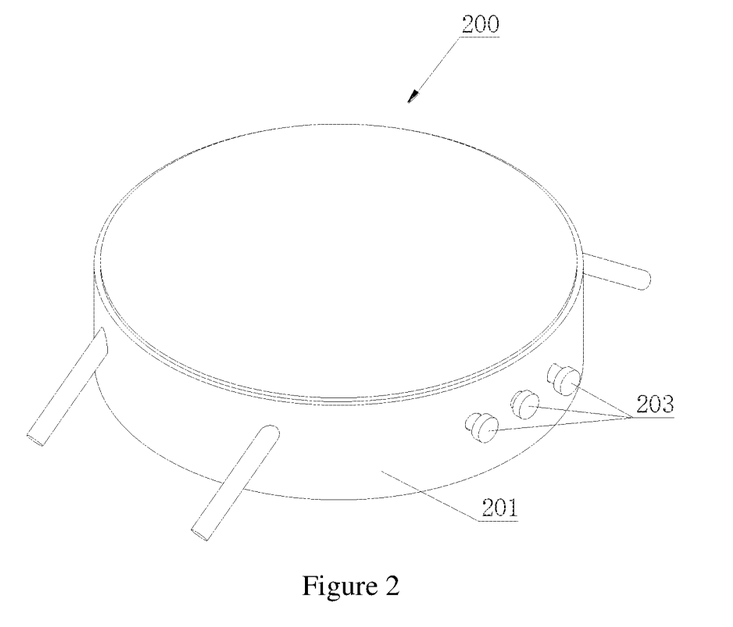
FIG. 2 is a schematic diagram of a watch equipped with a plurality of regulating components, in accordance with one embodiment.

FIG. 2 is a watch 200 equipped with three regulating components. As an option, the watch 200 may be implemented in the context of any one or more of the embodiments set forth in any previous and/or subsequence figure (s) and/or description thereof. Of course, the watch 200 may be implemented in the context of any desired environment.

As shown in FIG. 2, the watch 200 includes a round-faced housing 201 with the regulating components 203 on a periphery thereof. In this embodiment, the housing 201 of the watch 200 is round. In other embodiments, the housing 201 may be square, or oval or any other shapes. In addition, there are three regulating components 203 in this embodiment. In embodiments where two, four or other numbers of regulating components 203 are incorporated, these regulating components 203 may be similarly or differently constructed (e.g., one or more rotatable and one or more depressible) In an optional embodiment, the plurality of regulating components 203 are closely configured to improve the radiated antenna performance.

In this embodiment, an end, towards the outside of the housing 201, of each regulating component 303 extends out of a periphery of the housing 301. In another embodiment, the regulating components 203 are embedded in the housing 201, and a side, towards an outside of the housing 201, of each regulating component 203 is flush with a peripheral surface of the housing 201.

In this embodiment, the regulating components 203 may be in a shape illustrated by FIG. 2. In other embodiments, the regulating components 203 may be oval, round or cylindrical or in other regular or irregular shapes and may have different dimensions in three dimensional directions (X-axis direction, Y-axis direction and Z-axis direction). Further, in optional embodiments, the regulating component 203 may be of a solid structure, a hollow or mesh structure. The plurality of regulating components 203 can have similar or different shapes. Moreover, in an optional embodiment, the regulating components 203 may be of a solid, hollow or mesh structure. In an embodiment where the regulating components 203 are of a hollow structure, some mechanical and electrical structures can be entirely or partly arranged in the regulating components 203.

Figure 3:
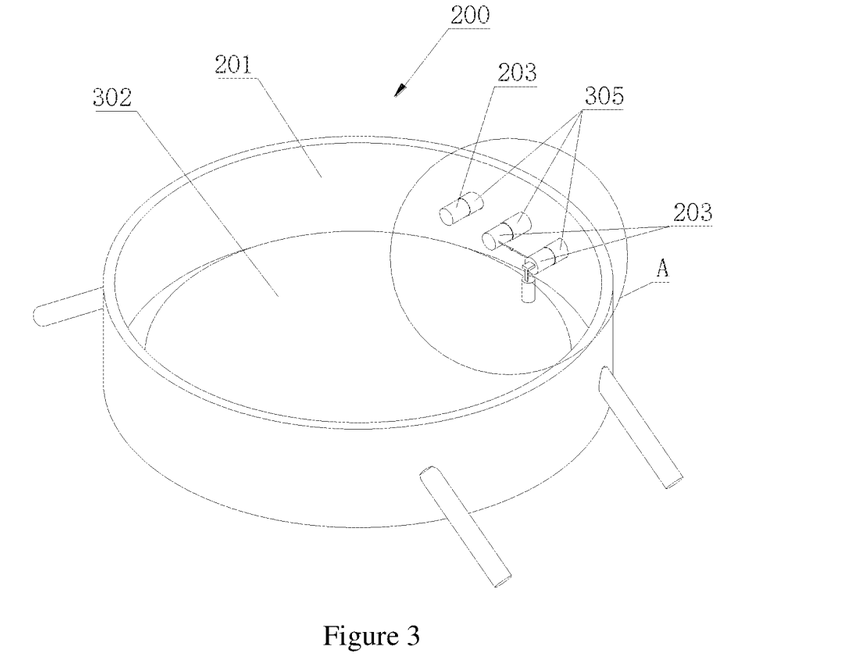
FIG. 3 is an internal structural view of FIG. 2.

FIG. 3 is an internal structural view of the watch in FIG. 2 after a transparent surface, dial plate and a battery or electronic device mounted on a circuit board are removed. As shown, a circuit board 302 is mounted in the housing 201 of the watch 200. In one embodiment, the circuit board 302 is a PCB made of a copper-single or multi layer rigid or flexible circuit, and the circuit on the PCB is used to provide any required function associated with the use of the watch 200.

In this embodiment, the housing 201 is made of a conductive material (e.g., stainless steel, aluminum, etc.), and each regulating component 203 is nested in a sleeve 305 made of an insulative material to be protected against electric contact with housing 201. In other embodiments where the housing 201 is made of a conductive material, a spacer (not shown) made of an insulative material may be disposed between each regulating component 203 and the housing 201 such that electrical contact between the housing 201 and the regulating component 203 is avoided. Of course, in one embodiment, the insulative spacer and the insulative sleeve 305 may be both configured. Of course, in other embodiments, the housing 201 may also be made of an insulative material (such as plastic ABS).

Figure 4:
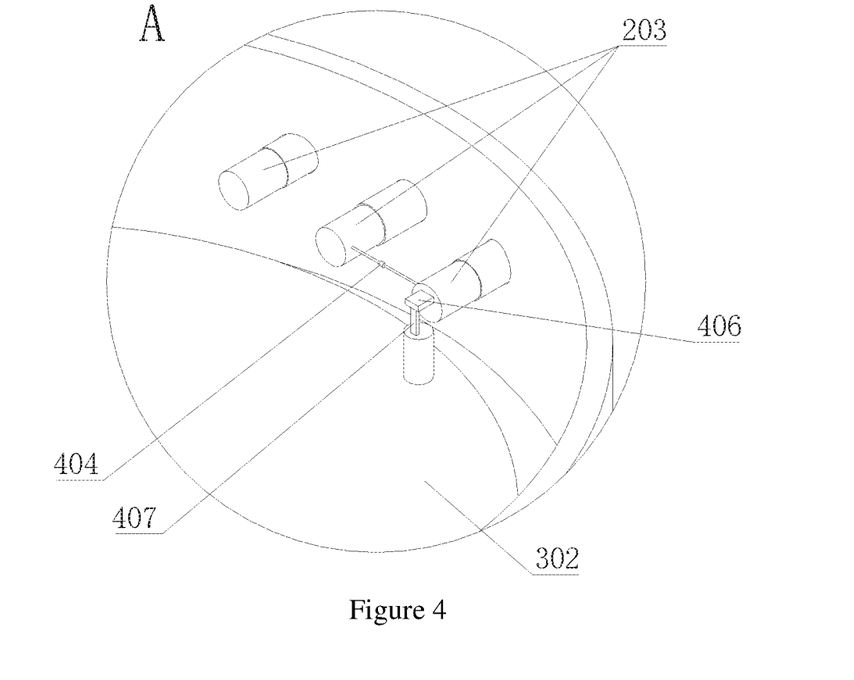
FIG. 4 is an enlarged view of part A in FIG. 3.

FIG. 4 is an enlarged view of part A in FIG. 3. As shown, in this embodiment, two regulating components 203 are connected through a connecting part 404, and one of the two regulating components 203 has a feed point 406, and the circuit board 302 is connected to the feed point 406 through a feed component 407.

In this embodiment, the connecting part 404 is disposed between the regulating components 203. In another embodiment, the connecting part 404 may be disposed on the circuit board 302. In addition, in this embodiment, the feed point 505 is disposed at a position illustrated in FIG. 4. In other embodiment, the feed point 505 may be disposed at other positions of the regulating components 203 in a lengthwise direction. In one embodiment, the feed components 407 are single-layer or multi-layer flexible feed lines. To facilitate antenna matching and radiation, each of the flexible feed lines may include discrete components or wires. In optional embodiments, the feed component 504 may be a single-layer or multi-layer flexible feed line, a C-clip or a pogo pin.

Figure 5:
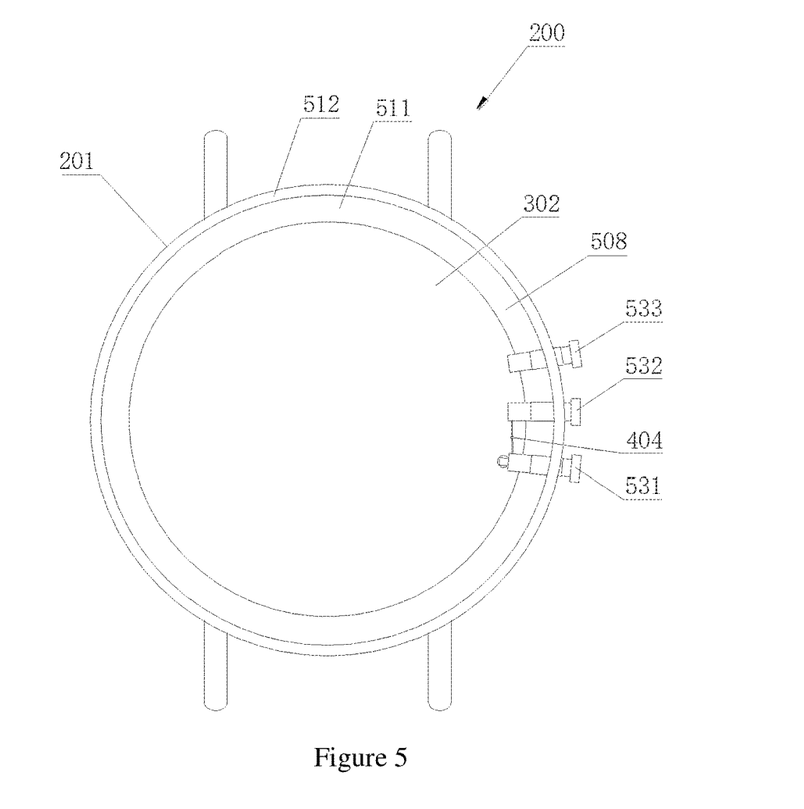
FIG. 5 is a top view of FIG. 4.

FIG. 5 is a top view of FIG. 3. As shown, the housing 201 comprises a back shell 511 and a frame 512, wherein the back shell 511 is configured to abut against the skin of a user, the frame 512 is disposed on the back shell 511, the circuit board 302 is disposed in a spaced defined by the frame 511 and the back shell 512, and to fulfill better radiation, an insulative region 508 is disposed between the circuit board 302 and the frame 512. In this embodiment, the insulative region 508 may be filled with air. In other embodiments, the insulative region 508 may be filled with insulative materials such as plastic or ceramic.

In an embodiment wherein three regulating components are configured, the three regulating components are respectively named as a first regulating component, a second regulating component and a third regulating component.

As shown in FIG. 5, in this embodiment, the first regulating component 531 is configured as the antenna feed and the second regulating component 532 are connected through the connecting part 404. In this embodiment, the third regulating component 533 neither is connected nor supplies power, serving as a parasitic element of the antenna. Of course, in another embodiment, the third regulating component 533 can be grounded (e.g., connected to a ground region on the circuit board) for radio frequency isolation. In an optional embodiment, when the third regulating component 533 is grounded, a matching network may be or may not be configured.

Of course, in another embodiment with where three regulating components are configured, the regulating components in a connected relationship may be combined in other manners, or a different regulating component supplies power.

Figure 6:
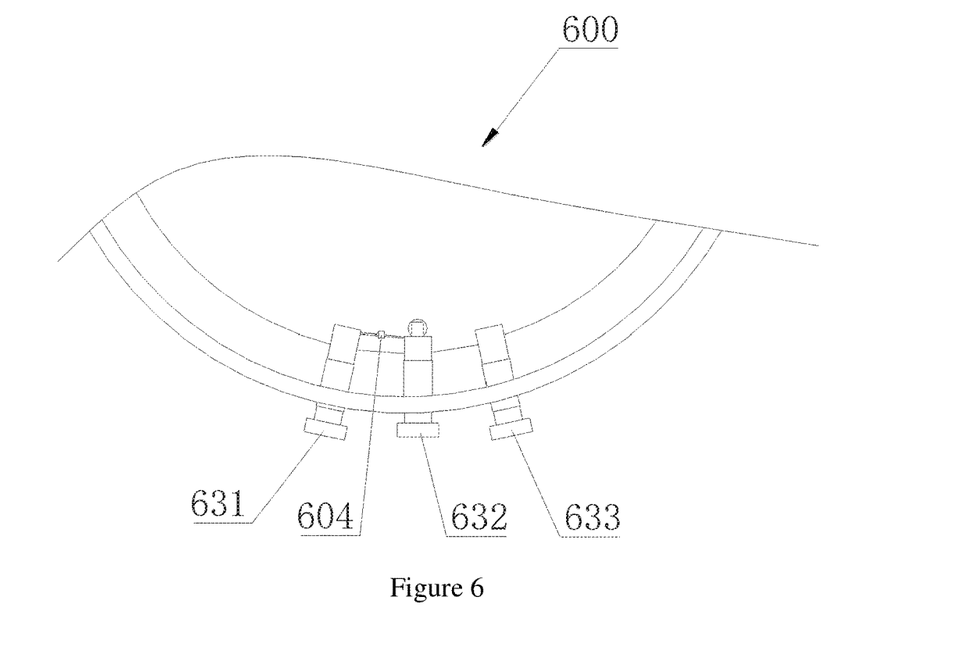
FIG. 6 illustrates a top view of an internal structure of an apparatus, in accordance with one possible embodiment, where the apparatus is equipped with three regulating components.

For example, FIG. 6 is a top view of the internal structure of an apparatus 600 equipped with three regulating components. As shown in FIG. 6, in another embodiment, the first regulating component 631 and the second regulating component 632 are connected through a connecting part 604, and the second regulating component 632 is configured as the antenna feed.

Figure 7:
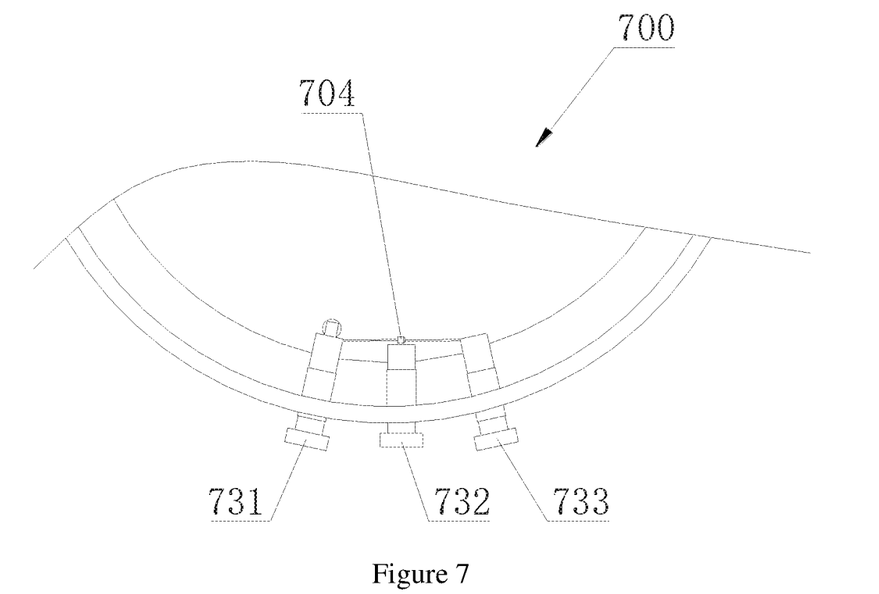
FIG. 7 illustrates a top view of an internal structure of an apparatus, in accordance with one possible embodiment, where the apparatus is equipped with three regulating components.

FIG. 7 is a top view of the internal structure of an apparatus 700 equipped with three regulating components. As shown in FIG. 7, in another embodiment, the first regulating component 731 and the third regulating component 733 are connected through a connecting part 704, and the first regulating component 731 is configured to the antenna feed.

Figure 8:
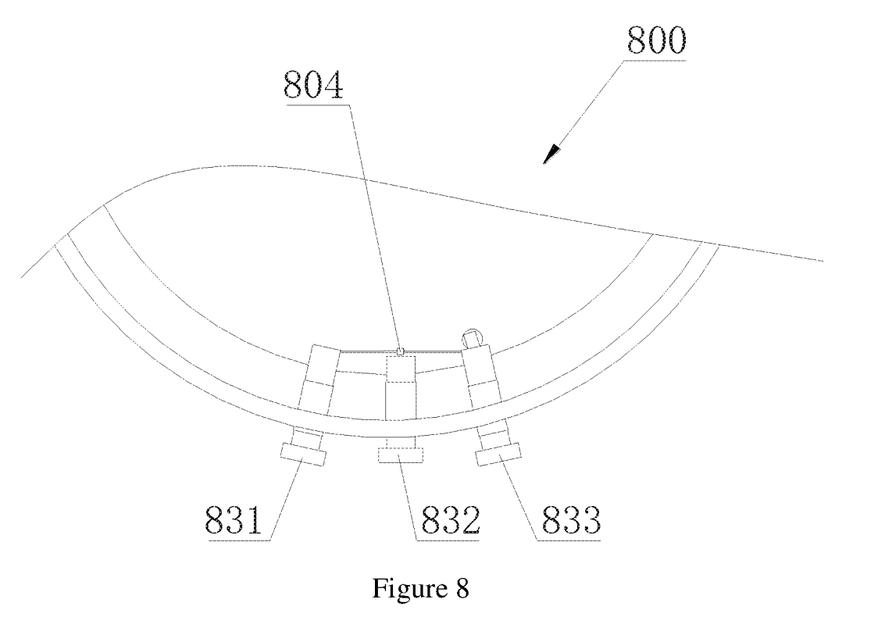
FIG. 8 illustrates a top view of an internal structure of an apparatus, in accordance with one possible embodiment, where the apparatus is equipped with three regulating components.

FIG. 8 is a top view of the internal structure of an apparatus 800 equipped with three regulating components. As shown in FIG. 8, in another embodiment, the first regulating component 831 and the second regulating component 833 are connected through a connecting part 804, and the third regulating component 833 is configured as the antenna feed.

Figure 9:
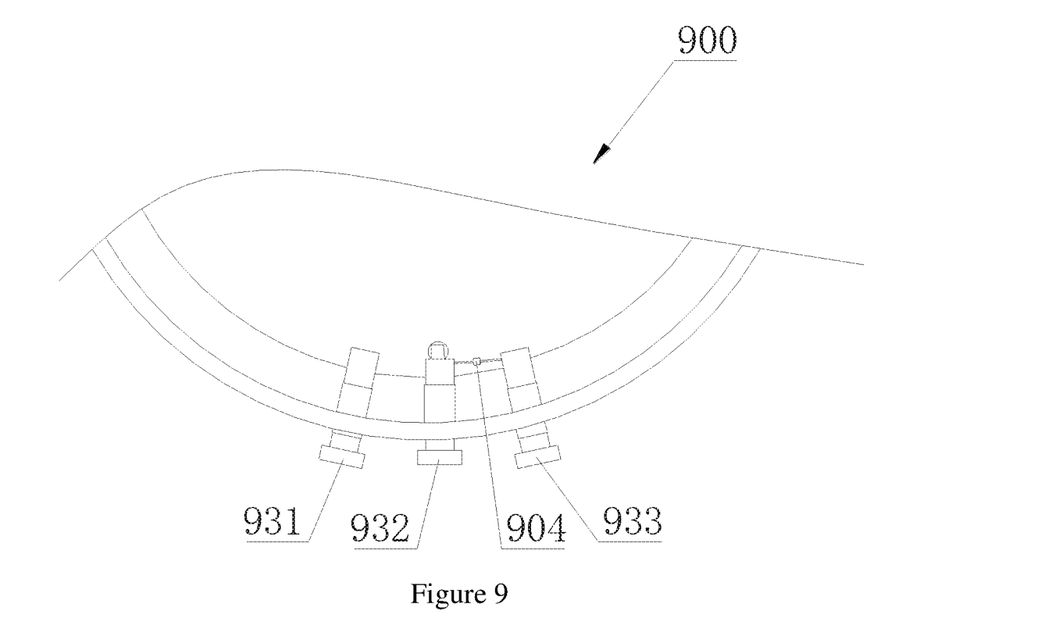
FIG. 9 illustrates a top view of an internal structure of an apparatus, in accordance with one possible embodiment, where the apparatus is equipped with three regulating components.

FIG. 9 is a top view of the internal structure of an apparatus 900 equipped with three regulating components. As shown in FIG. 9, in another embodiment, the second regulating component 932 and the third regulating component 933 are connected through a connecting part 904, and the second regulating component 932 is configured as the antenna feed.

Figure 10:
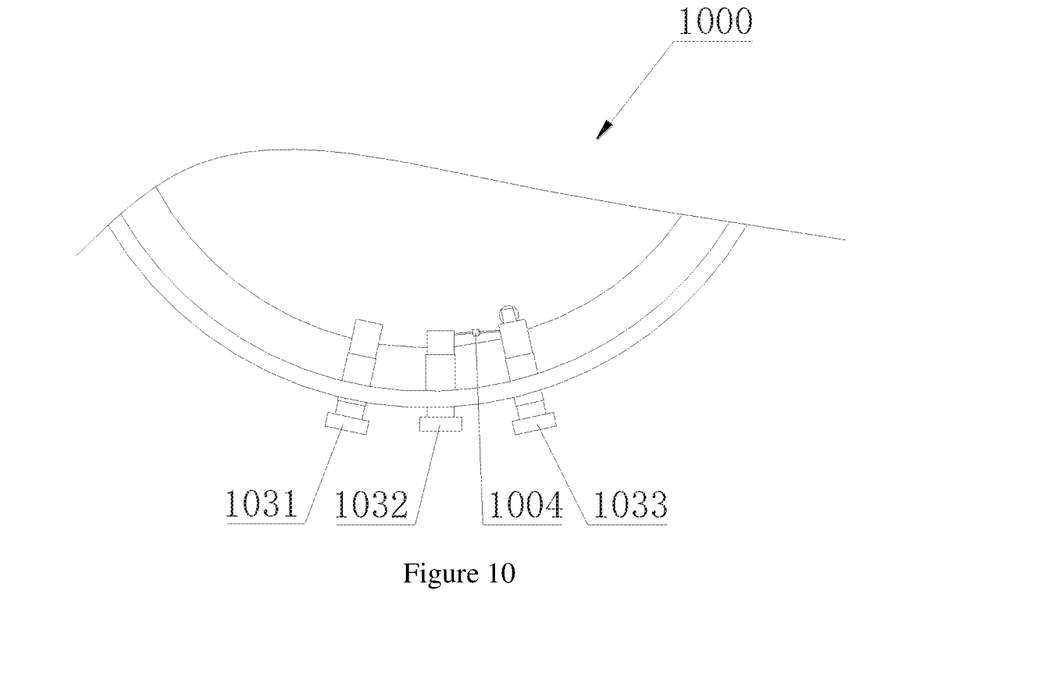
FIG. 10 illustrates a top view of an internal structure of an apparatus, in accordance with one possible embodiment, where the apparatus is equipped with three regulating components.

FIG. 10 is a top view of the internal structure of an apparatus 1000 equipped with three regulating components. As shown in FIG. 10, in another embodiment, the second regulating component 1032 and the third regulating component 1033 are connected through a connecting part 1004, and the third regulating component 1033 is configured as the antenna feed.

Figure 11:
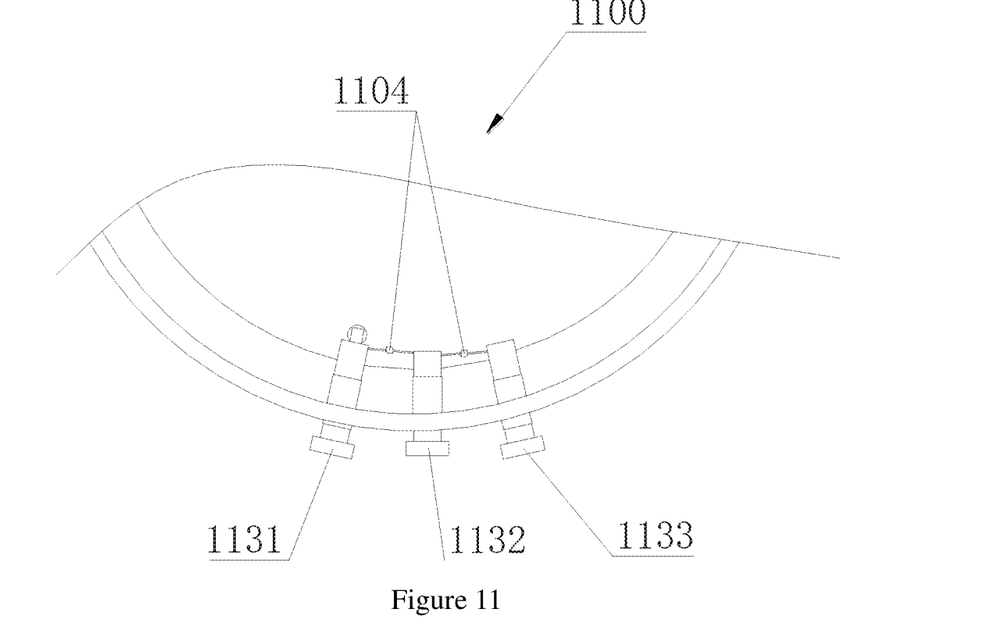
FIG. 11 illustrates a top view of an internal structure of an apparatus, in accordance with one possible embodiment, where the apparatus is equipped with three regulating components.

FIG. 11 is a top view of the internal structure of an apparatus 1100 equipped with three regulating components. As shown in FIG. 11, in another embodiment, the first regulating component 1131, the second regulating component 1132 and the third regulating component 1133 are connected in turn through a connecting part 1104, and the third regulating component 1131 is configured as the antenna feed.

Figure 12:
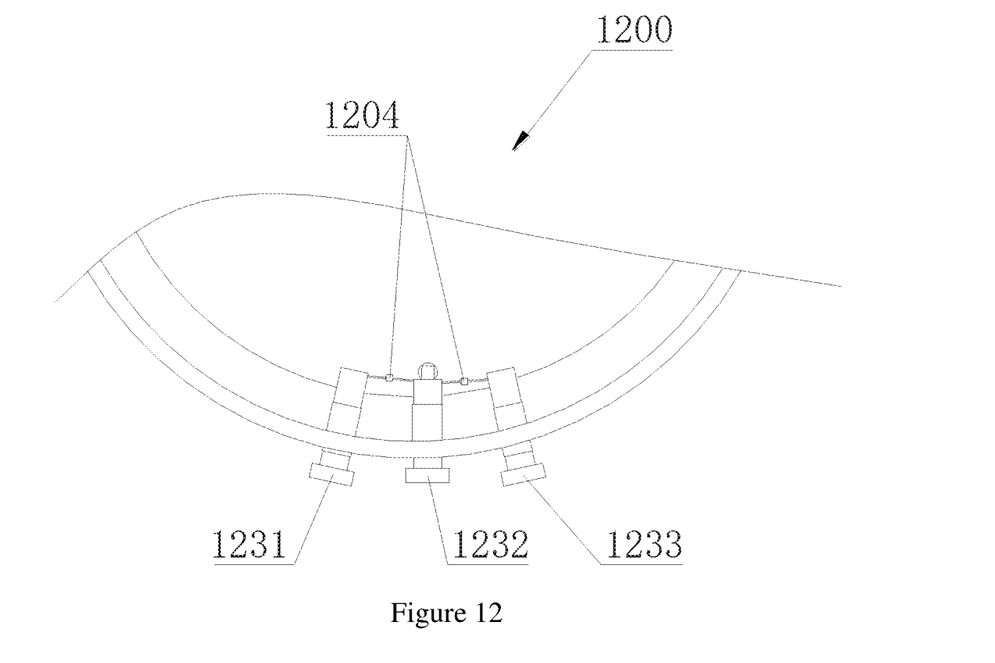
FIG. 12 illustrates a top view of an internal structure of an apparatus, in accordance with one possible embodiment, where the apparatus is equipped with three regulating components.

FIG. 12 is a top view of the internal structure of an apparatus 1200 equipped with three regulating components. As shown in FIG. 12, in another embodiment, the first regulating component 1231, the second regulating component 1232 and the third regulating component 1233 are connected in turn through a connecting part 1204, and the second regulating component 1232 is configured as the antenna feed.

Figure 13:
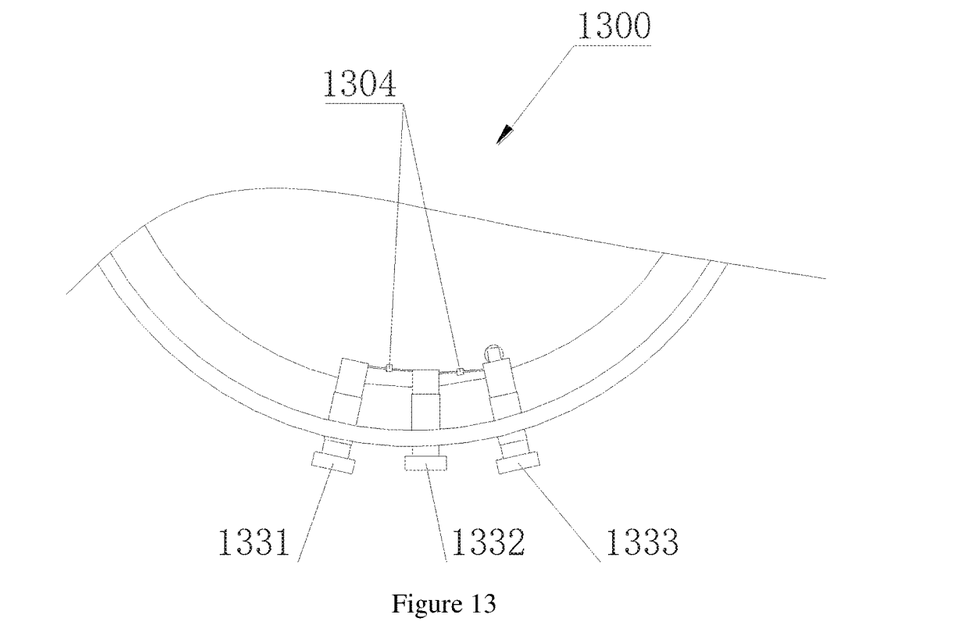
FIG. 13 illustrates a top view of an internal structure of an apparatus, in accordance with one possible embodiment, where the apparatus is equipped with three regulating components.

FIG. 13 is a top view of the internal structure of an apparatus 1300 equipped with three regulating components.

As shown in FIG. 13, in another embodiment, the first regulating component 1331, the second regulating component 1332 and the third regulating component 1333 are connected in turn through a connecting part 1304, and the third regulating component 1333 supplies power.

In one or more embodiments, one of the regulating components other than the regulating components for power supply can be grounded for radio frequency isolation, and can further be used as a parasitic element instead of being grounded. In an embodiment where one regulating component is grounded, a matching network may be or may not be configured.

Figure 14:
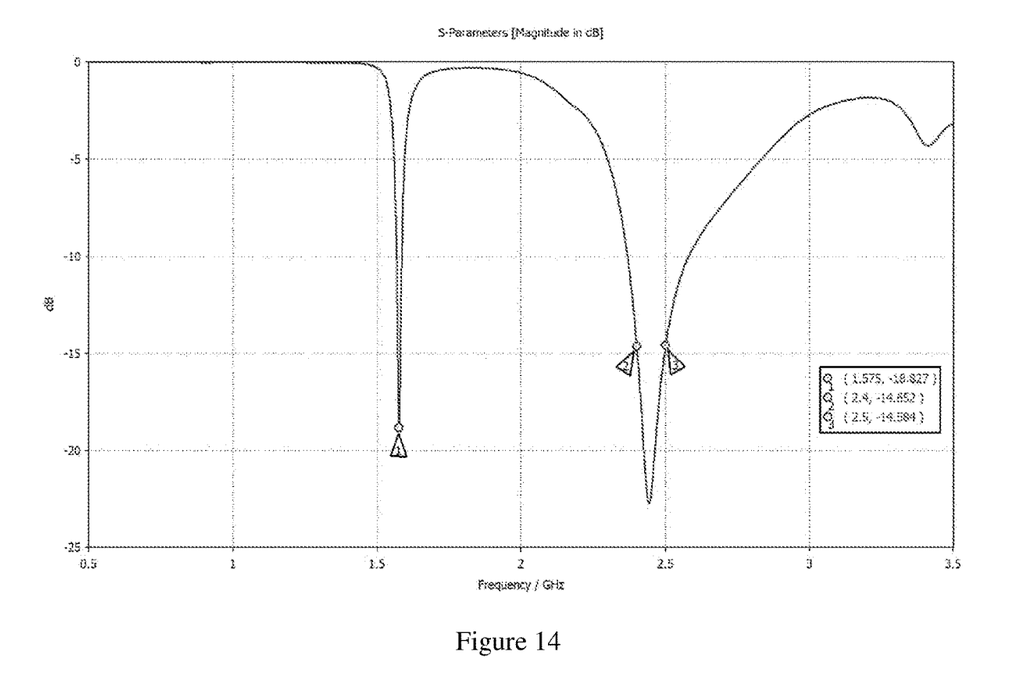
FIG. 14 illustrates a signal diagram illustrating a wireless S parameter of a watch tested on a simulated wrist, in accordance with one embodiment.
Figure 15:
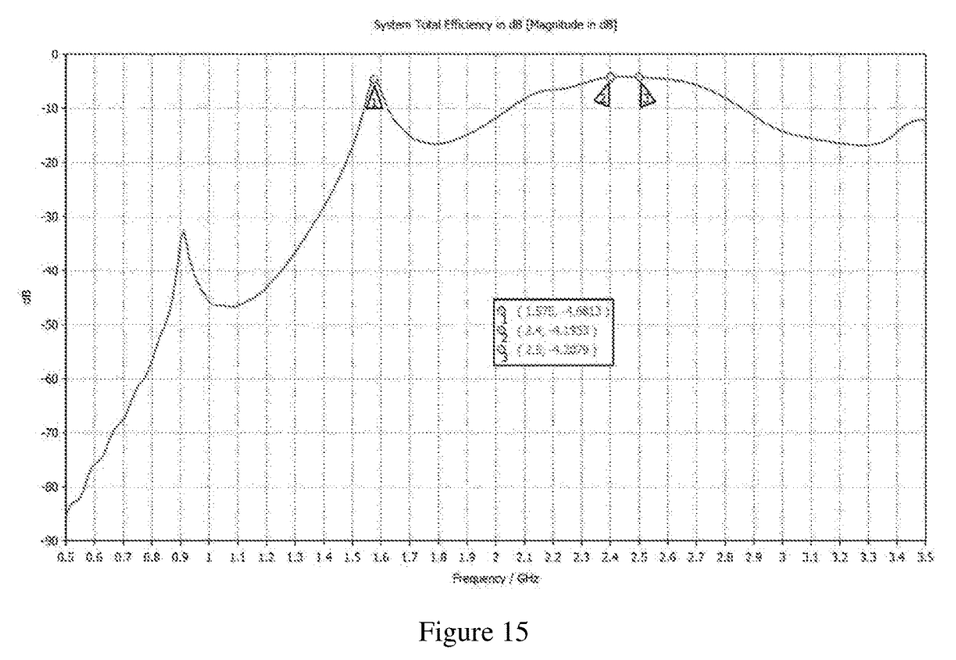
FIG. 15 illustrates a signal diagram illustrating the overall system efficiency of a watch tested on a simulated wrist, in accordance with one embodiment.

FIG. 14 and FIG. 15 are respectively schematic views illustrating a parameter S and an overall system antenna efficiency plots of a watch worn on a simulating wrist and undergoing CTIA test, in accordance with according one embodiment. In this embodiment, the first regulating component and the second regulating component are connected through a connecting part, and the first regulating component supplies power. From the figures it can be seen that this embodiment can be used for communicating radio frequency signals, and achieve less return loss and relatively high antenna efficiency at some frequency bands.

Figure 16:
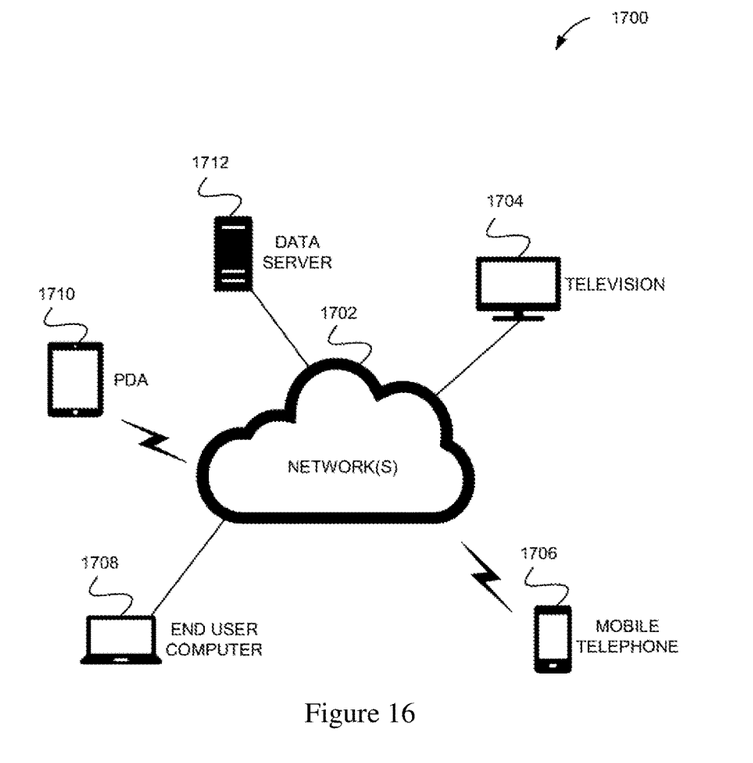
FIG. 16 illustrates a network architecture, in accordance with one embodiment.

FIG. 16 illustrates a network architecture 1700. For example, in one embodiment, the watch from one or more of the previous embodiments may be implemented in the context of the current network architecture 1700.

As shown, at least one network 1702 is provided. In the context of the present network architecture 1700, the network 1702 may take any form including, but not limited to, a telecommunications network, a local area network (LAN), a wireless network, a wide area network (WAN) such as the Internet, etc. While only one network is shown, it should be understood that two or more similar or different networks 1702 may be provided.

Coupled to the network 1702 is a plurality of devices. For example, a server computer 1712 and an end user computer 1708 may be coupled to the network 1702 for communication purposes. Such end user computer 1708 may include a desktop computer, a lap-top computer, and/or any other type of logic. Still yet, various other devices may be coupled to the network 1702 including a personal digital assistant (PDA) device 1710, a mobile phone device 1706, a television 1704, etc.

Figure 17:
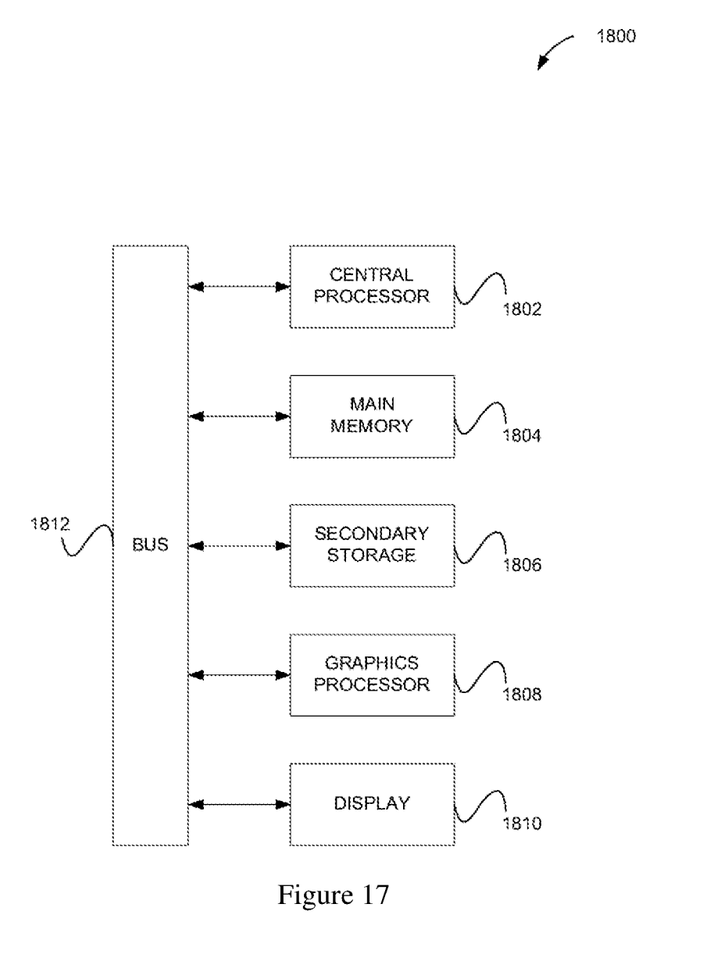
FIG. 17 illustrates an exemplary system, in accordance with one embodiment.

FIG. 17 illustrates an exemplary system 1800, in accordance with one embodiment. As an option, the system 1800 may be implemented in the context of any of the devices of the network architecture 1700 of FIG. 16, including a watch disclosed in one or more of the embodiments described hereinabove. Just by way of example, the apparatus 100 of FIG. 1 and/or the watch 200 of FIG. 2 may be equipped with one or more of the components of the system 1800. Of course, the system 1800 may be implemented in any desired environment.

As shown, a system 1800 is provided including at least one central processor 1802 which is connected to a communication bus 1812. The system 1800 also includes a main memory 1804 [e.g., random access memory (RAM), etc.]. The system 1800 also includes a graphics processor 1808 and a display 1810.

The system 1800 may also include a secondary storage 1806. The secondary storage 1806 includes, for example, a hard disk drive and/or a removable storage drive, representing a floppy disk drive, a magnetic tape drive, a compact disk drive, etc. The removable storage drive reads from and/or writes to a removable storage unit in a well-known manner.

Computer programs, or computer control logic algorithms, may be stored in the main memory 1804, the secondary storage 1806, and/or any other memory, for that matter. Such computer programs, when executed, enable the system 1800 to perform various functions (as set forth above, for example). Memory 1804, storage 1806 and/or any other storage are possible examples of tangible computer-readable media.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards and digital video disks. Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical and electromagnetic formats. A non-exhaustive list of a conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™3), a BLU-RAY disc; and the like.

It should be understood that arrangement of components illustrated in the Figures described are exemplary and that other arrangements are possible. It should also be understood that the various system components (and means) defined by the claims, described below, and illustrated in the various block diagrams represent logic components in some systems configured according to the subject matter disclosed herein.

For example, one or more of these system components (and means) may be realized, in whole or in part, by at least some of the components illustrated in the arrangements illustrated in the described figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component of one or more embodiments may be implemented at least partially as an electronic hardware component, such as an instruction execution machine (e.g., a processor-based or processor-containing machine) and/or as specialized circuits or circuitry (e.g., discrete logic gates interconnected to perform a specialized function). Other components may be implemented in software, hardware, or a combination of software and hardware. Moreover, some or all these other components may be combined, some may be omitted altogether, and additional components may be added while still achieving the functionality described herein. Thus, the subject matter described herein may be embodied in many different variations, and all such variations are contemplated to be within the scope of one or more embodiments.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner wall understood by those skilled in the art. The data is maintained at physical locations of the memory as data structures that have particular properties defined by the format of the data. However, while the subject matter is being described in the foregoing context, it is not meant to be limiting as those of skill in the art will appreciate that various of the acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a", "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated therein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any or all examples, or exemplary languages (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions are bright about that result. No language in the specification should be construed as indicating any non-claimed element as essential to the practice of the invention as claimed.

The embodiments described therein included the one or more modes known to the inventor for carrying out the claimed subject matter. Of course, variations of those embodiments will become apparent to those of ordinary skilled in the art upon reading the foregoing description. The inventor expects skilled artisans to employ such variations as appropriate, and the inventor intends for the claimed subject matter to be practiced otherwise than as specifically described therein. Accordingly, this claimed subject matter includes all modifications and equivalents of the subject matter recited in the claims appended hereinto as permitted by applicable law. Moreover, any combination of the above-described elements in all possible variations thereof is encompassed unless otherwise indicated therein or otherwise clearly contradicted by context.

The invention claimed is:

1. An apparatus, comprising:
   a housing;
   a circuit board disposed in the housing; and
   a plurality of regulating components respectively connected to the housing,
   wherein at least two of the regulating components are connected through a connecting part, and one of the connected regulating components is in a feed connection with the circuit board, and
   wherein a spacer is disposed between each said regulating component, and the housing and is made of an insulative material.

2. The apparatus according to claim 1, wherein the regulating components are rotatably connected to the housing.

3. The apparatus according to claim 2, wherein the apparatus is configured to generate a signal in response to a movement of the regulating components.

4. The apparatus according to claim 1, wherein the connecting part is disposed between the regulating components or on the circuit board.

5. The apparatus according to claim 1, wherein one of the regulating components which are connected through the connecting part has a feed point, and the circuit board is connected to the feed point through a feed component.

6. The apparatus according to claim 5, wherein the feed components are single-layer or multi-layer feed lines, C-clips or pogo pins.

7. The apparatus according to claim 1, wherein one of the regulating components other than the regulating component in the feed connection with the circuit board is grounded.

8. The apparatus according to claim 1, wherein the circuit board is made of a copper-single or multi layer rigid or flexible circuit.

9. The apparatus according to claim 1, wherein each of the regulating components is embedded in the housing, and a side, towards an outside of the housing, of each said regulating component is flush with a peripheral surface of the housing; or, an end, towards the outside of the housing, of each said regulating component extends out of a periphery of the housing.

10. The apparatus according to claim 1, wherein each said regulating component and the housing have one, two or more contact points therebetween.

11. The apparatus according to claim 1, wherein the housing comprises a back shell and a frame disposed on the back shell, the circuit board is disposed in a space defined by the frame and the back shell, and an insulative region is disposed between the circuit board and the frame.

12. The apparatus according to claim 1, wherein each of the regulating components is nested in a sleeve which is made of an insulative material.

13. The apparatus according to claim 1, wherein each of the regulating components is nested in a sleeve which is made of an insulative material.

14. The apparatus according to claim 1, wherein the housing includes a conductive material.

15. The apparatus according to claim 1, wherein the regulating components are made of a conductive material or are made of the conductive material and an insulative material.

16. The apparatus according to claim 1, wherein each of the regulating components is oval, round or cylindrical, or is in other regular or irregular shapes.

17. The apparatus according to claim 1, wherein the regulating components are of a solid structure, a hollow structure, or a mesh structure.

18. The apparatus according to claim 1, wherein the regulating components are push buttons, rotary knobs or rocker switches.

19. The apparatus according to claim 1, being a wearable device.

* * * * *